United States Patent
Koning et al.

(10) Patent No.: US 6,813,153 B2
(45) Date of Patent: Nov. 2, 2004

(54) POLYMER SOLDER HYBRID

(75) Inventors: Paul A. Koning, Chandler, AZ (US); Fay Hua, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/246,225

(22) Filed: Sep. 18, 2002

(65) Prior Publication Data

US 2004/0052050 A1 Mar. 18, 2004

(51) Int. Cl.⁷ .............................................. H05K 7/20
(52) U.S. Cl. .................... 361/700; 165/80.2; 165/80.3; 165/18.5; 174/16.3; 174/15.2; 257/707; 257/713; 361/704; 361/702; 361/708; 228/180.21; 228/123.1; 428/40.5; 428/41.3; 428/673; 428/402; 428/645; 428/616
(58) Field of Search .............................. 165/80.2, 80.3, 165/104.33, 185, 907, 80.4; 176/16.3, 15.2; 257/706–707, 712–715; 228/180.21, 123.1; 361/704–710, 717–722; 428/106, 122, 209, 40.5, 41.3, 41.8, 408, 901, 402, 614, 645, 673; 524/432, 495, 437

(56) References Cited

U.S. PATENT DOCUMENTS

| | | | |
|---|---|---|---|
| 5,513,070 A | | 4/1996 | Xie et al. |
| 5,598,320 A | * | 1/1997 | Toedtman et al. .......... 361/687 |
| 6,108,208 A | * | 8/2000 | Tustaniwskyj et al. ..... 361/705 |
| 6,339,120 B1 | | 1/2002 | Misra et al. |

OTHER PUBLICATIONS

U.S. 2001/0032719 Kim et al "Thermal Joint and Method of Use" Oct. 25, 2001.*
U.S. 2003/0077478 Dani et al " Thermal Interface Material and Electronic Assembly Having Such a Thermal Interface Material" Apr. 24, 2003.*

* cited by examiner

Primary Examiner—Gregory D. Thompson
(74) Attorney, Agent, or Firm—Blakely, Sokoloff, Taylor & Zafman LLP

(57) ABSTRACT

A polymer solder hybrid (PSH) thermal interface material (TIM). The PSH TIM includes a solder with a low melt temperature and a filler with a high melt temperature. Upon initiation of reflow, the filler diffuses into the solder to form a new filler-solder alloy having an increased melting point and added robustness.

22 Claims, 8 Drawing Sheets

POLYMER SOLDER HYBRID

BACKGROUND

1. Technical Field

An embodiment relates generally to thermal interface materials, and in particular relates to thermal interface materials to secure a heat management device to a die surface.

2. Description of the Related Art

In the fabrication of semiconductors devices, wafers are processed and sliced into individual dice. The dice may then be used in a wide variety of devices. For example, a die may be used in an electronic device by being electronically coupled to a printed circuit board (PCB) of the device. A thermal management device such as a heat pipe assembly is often attached to a surface of the die to dissipate heat to prevent damage to the die during operation.

In order to attach a thermal management device to a die surface, a thermal interface material (TIM) adhesive is placed at a surface of the die and used to secure the device. Conventional TIMs include polymer solder hybrids (PSHs). Such a hybrid may include a siloxane-based polymer and a solder such as indium-silver, indium-tin, tin-bismuth, gallium-tin-indium, gallium-indium-tin-zinc, indium-bismuth, gold-tin or other solder material. Additionally, thermally conductive fillers such as aluminum, silver, copper, or graphite may also be added to the PSH TIM. The combination of conductive filler and solder allows for the formation of thermally conductive pathways or chains throughout the PSH TIM. In this manner, heat generated within the die may be readily transferable across such chains to the attached thermal management device for dissipation as noted above.

In order to form the indicated chains and properly secure the thermal management device to the die, the PSH TIM is heated by a reflow process to at least the melting point of the solder. 183° C. is considered the industry standard dividing line between 'low melt' and 'high melt' solders. Where conventional solders, such as those noted above, are used, the PSH TIM may be a high melt solder requiring reflow at temperatures in excess of about 260° C., for the solder to melt and allow the filler to diffuse thereinto. For example, a temperature of 260° C. may be required where a gold-tin solder is employed in the PSH TIM. However, even where other conventional solders are employed, it is not uncommon for a temperature in excess of about 183° C. to be employed.

A PSH TIM may be employed to secure a thermal management device to a temperature sensitive assembly. For example, larger mobile or bare die assemblies incorporated into an already assembled computing box, such as a laptop, may require use of a PSH TIM. Such assemblies may include a die requiring attachment of a heat management device such as a heat pipe. These assemblies include more than just a die or individual semiconductor package. Rather, these assemblies are closer to being a completed computer, such as the indicated laptop, with added temperature sensitive features.

For temperature sensitive assemblies as noted above, low melt solders are available having melting points lower than about 183° C. However, a PSH to serve as a TIM that employs a low melt solder tends to be highly susceptible to degradation when subjected to standard industry testing. Industry tests may include a Highly Accelerated Stress Test (HAST) which includes PSH exposure to more than 100° C. (e.g., about 130° C.) with relative humidity of more than 50% (e.g., about 85%) for in excess of about 75 hours (e.g. about 100 hours), or a standard bake test which includes PSH exposure to even higher temperature (e.g., 150° C. for about 100 hours) without degradation. Unfortunately, a PSH employing a low melt solder tends to degrade in between about 24 and 48 hours when subjected to such tests.

BRIEF DESCRIPTION OF THE DRAWINGS

The invention may be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

Descriptions of polymer solder hybrid (PSH) embodiments follow. In particular, embodiments of PSH thermal interface material (TIM) are described. Particular embodiments are described with reference to the accompanying drawings. However, additional features and modifications are also within the scope of the embodiments described below.

Embodiments described below include a PSH TIM to secure a thermal management assembly to a die surface. While embodiments are described with reference to a particular PSH TIM employing an indium-tin-bismuth solder and a gold filler, the embodiments are applicable to any PSH TIM to employ a low melt solder with a high melt filler to display increased robustness upon application of reflow.

Figure 1:
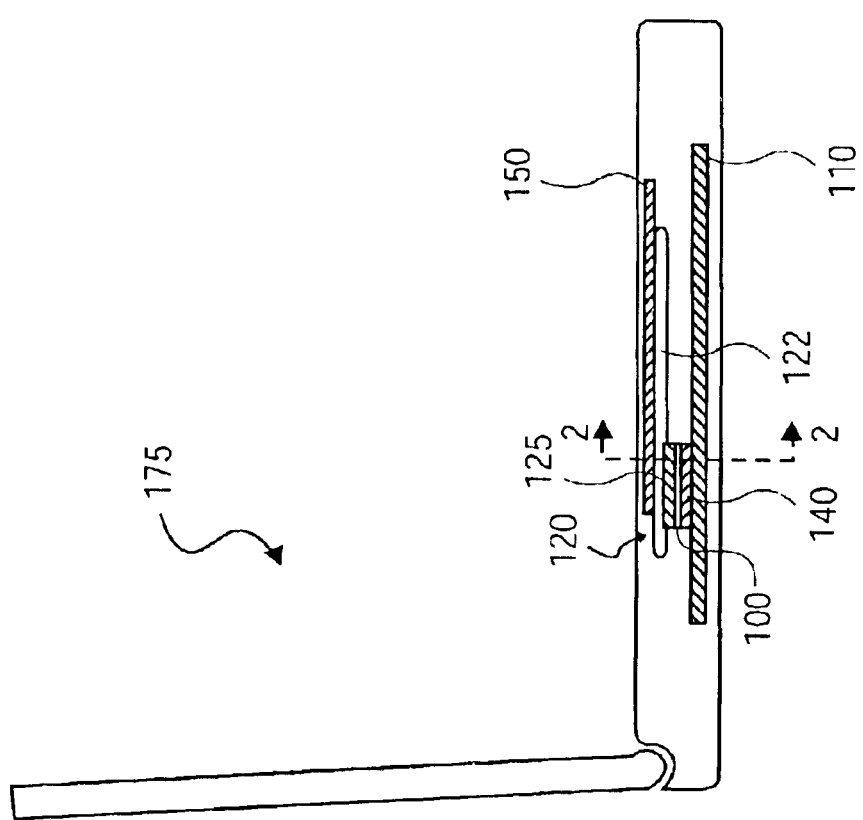
FIG. 1 is a partially sectional view of a laptop including a die with a polymer solder hybrid for use as a thermal interface material, according to one embodiment of the invention.

Referring now to FIG. 1, a laptop computer 175 is shown. A cross-sectional portion of the laptop computer 175 reveals a printed circuit board (PCB) 110 through which various computing functions to be performed by the laptop computer 175 are organized. A die 140 is electronically coupled to the PCB 110 providing micro-processing capacity. Additionally, in the embodiment shown, a thermal management assembly 120 is attached to a surface of the die 140 for directing heat away from the die 140 as described further below.

In the embodiment shown, the thermal management assembly 120 includes a heat pipe 122 for quickly transferring heat from one point to another. In this manner, heat generated within the die 140 during its operation is removed from the vicinity to prevent damage to the die 140. The heat pipe 122 may include a sealed aluminum or copper container with inner surfaces including capillary wicking material for heat transport. In alternate embodiments, the thermal management assembly 120 may include other heat management features such as an integrated heat spreader (IHS) or a heat sink to direct heat away from the die 140.

Figure 2:
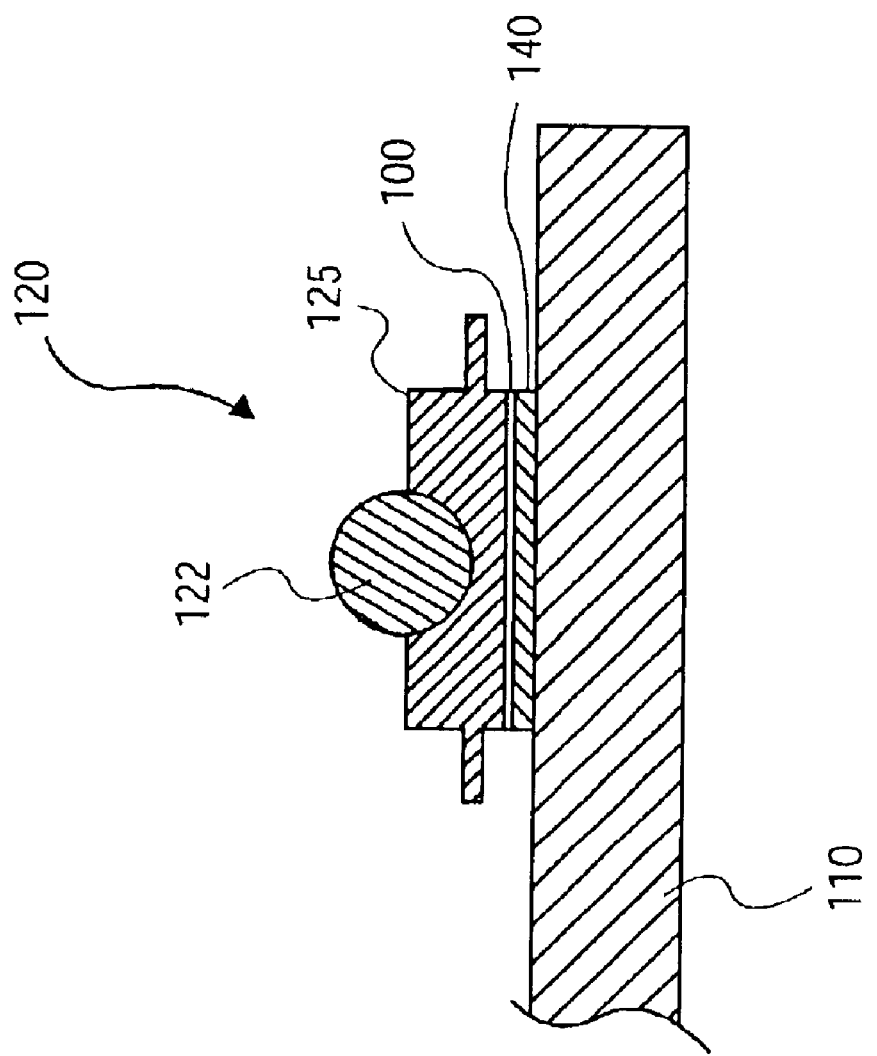
FIG. 2 is a side cross-sectional view of the die with polymer solder hybrid of FIG. 1 taken from section lines 2—2 of FIG. 1, according to one embodiment of the invention.

Continuing with reference to FIGS. 1 and 2, the thermal management assembly 120 includes a block 125 to which the heat pipe 122 is secured. The block 125 may be of aluminum or other suitable heat conducting metal or other material. Additionally, the heat pipe 122 may be coupled to a metal plate 150 to which heat transferred through the heat pipe 122 is dissipated. In this manner, the thermal management assembly 120 transfers heat from the die 140 to the metal plate 150. In an alternate embodiment, the thermal management assembly 120 may transfer heat from the die 140 to the vicinity of a fan for heat dissipation. The thermal management assembly 120 is secured to the die 140 by an embodiment of a PSH TIM 100.

As described further below, embodiments of the PSH TIM 100 may be employed which do not require application of reflow temperatures in excess of 183° C. in order to properly secure the thermal management assembly 120 to the die 140. For example, embodiments of the PSH TIM 100 may be subjected to reflow that includes exposure to a temperature of no more than about 150° C., possibly no more than about 80° C., for securing the thermal management assembly 120 to the die 140. In this manner, a PSH TIM 100 is provided that does not require application of temperatures more likely to be hazardous to surrounding temperature sensitive components of the laptop 175. Additionally, as described further below, following reflow the PSH TIM 100 solidifies to form a resilient interface which remains robust and intact. The PSH TIM 100 remains stable and reliable even upon exposure to extreme conditions, such as application of a highly accelerated stress test (HAST) with application of temperatures in excess of about 100° C. for more than about 75 hours.

Figure 3:
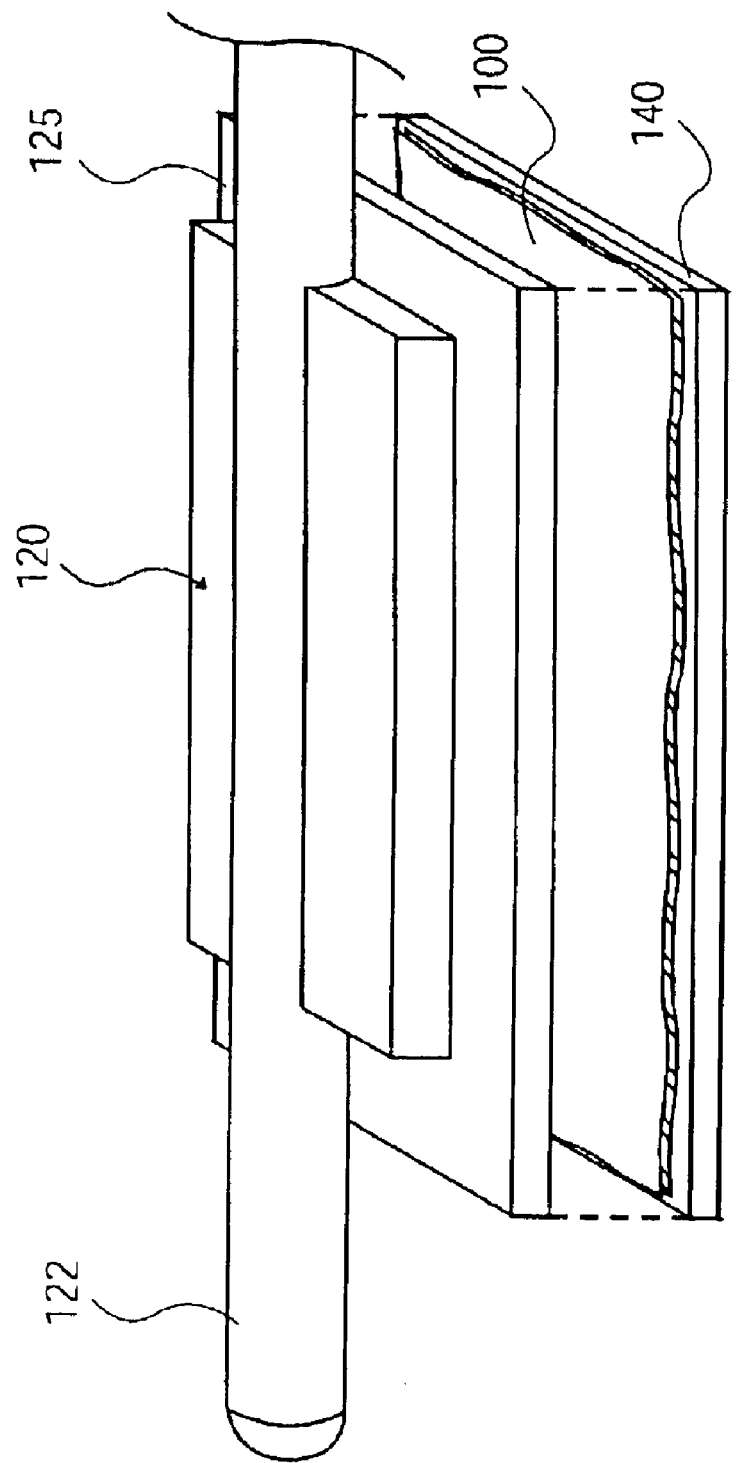
FIG. 3 is a partially exploded perspective view of the die with polymer solder hybrid of FIG. 2, according to one embodiment of the invention.
Figure 8:
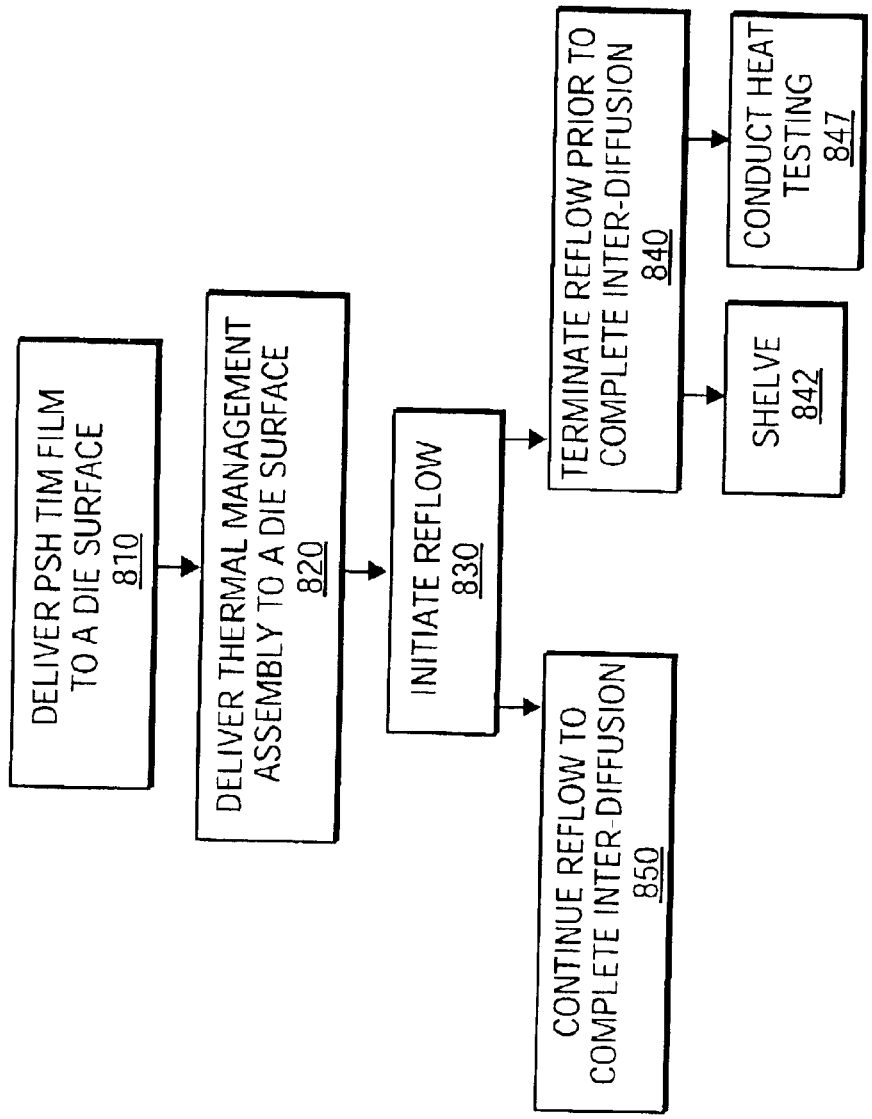
FIG. 8 is a flow chart of the use of a polymer solder hybrid, according to one embodiment of the invention.

Referring to FIGS. 2 and 3, an embodiment of the PSH TIM 100 of FIG. 1 is shown delivered to a surface of the die 140. The PSH TIM 100 may be in the form of a properly sized film or preform incorporating the PSH TIM 100 and delivered by a conventional pick and place mechanism as shown at block 810 of FIG. 8. Alternatively, a form of the PSH TIM 100 in which the polymer fraction is fluid at application temperature may be delivered to a surface of the die 140 by syringe delivery. FIG. 8 is a flow chart describing a method of using the PSH TIM 100. In order to aid in the discussion of various embodiments, FIG. 8 is referenced throughout the following description.

Referring to FIG. 3, the thermal management assembly 120 is shown above the die 140 in a partially exploded view. The PSH TIM 100 is shown placed at a surface of the die 140. In the embodiment shown, the PSH TIM 100 is in film form, cut to match the surface dimensions of the die 140. After the PSH TIM 100 is placed, the thermal management assembly 120 may be delivered.

Continuing with reference to FIGS. 2 and 3, the PSH TIM 100 is shown placed at the surface of the die 140 as indicated above. However, the PSH TIM 100 may also be used in securing components of the thermal management assembly 120 to one another. For example, in one embodiment, PSH TIM 100 is positioned between the block 125 and the heat pipe 122 for securing the heat pipe 122 to the block 125. Similarly, in another embodiment, PSH TIM 100 may be positioned between the heat pipe 122 and the metal plate 150 (see FIG. 1).

Figure 4:
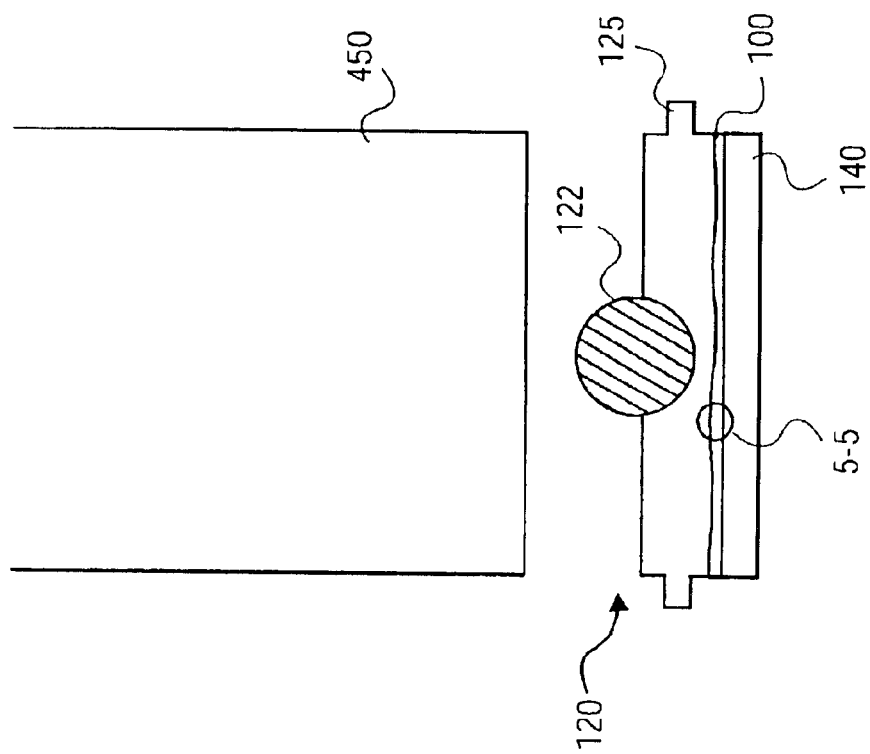
FIG. 4 is a side view of the die with polymer solder hybrid of FIG. 3 exposed to a heat gun, according to one embodiment of the invention.

Referring to FIG. 4, the thermal management assembly 120 is delivered to a surface of the die 140 as indicated at block 820 of FIG. 8, with PSH TIM 100 there between. As shown at block 830 of FIG. 8, reflow is initiated and directed toward the PSH TIM 100. The reflow proceeds by application of heat, for example by a heat gun 450. The heat gun 450 may be a conventional device having a cylindrical portion as shown in FIG. 4 to direct a column of heated air toward the PSH TIM 100. Embodiments of reflow described below include application of temperatures below about 183° C. For example, depending upon the particular makeup of the PSH TIM 100, in various embodiments reflow may proceed by application of temperatures ranging from about 80° C. to about 150° C.

Figure 5:
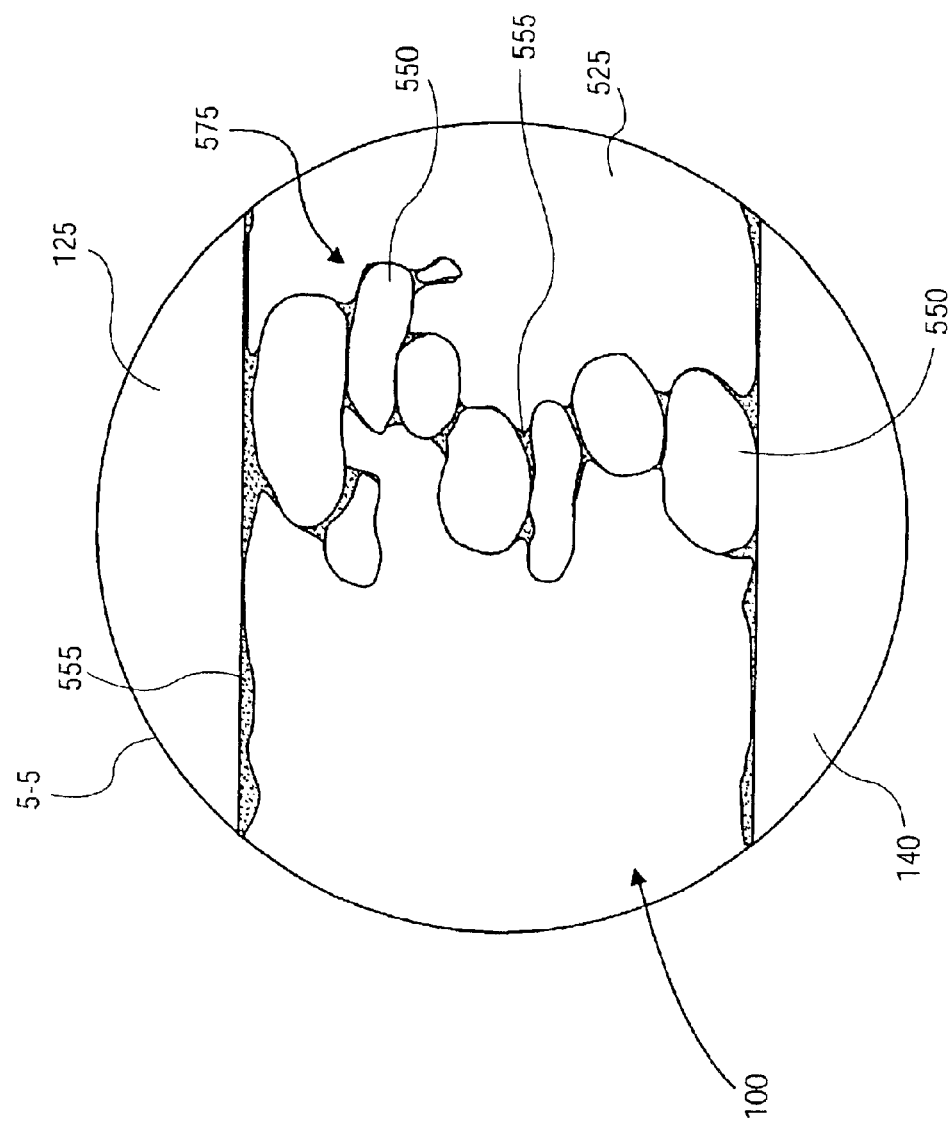
FIG. 5 is a magnified view of the polymer solder hybrid of FIG. 4, according to one embodiment of the invention.

Referring to FIGS. 4 and 5, the makeup of embodiments of the PSH TIM 100 are described in further detail. FIG. 5 is an exploded view of the PSH TIM 100 taken from section 5—5 of FIG. 4. FIG. 5 reveals the PSH TIM 100 as an interface between the die 140 and the block 125. The PSH TIM 100 includes a polymer adhesive 525 securing the block 125 to the die 140. The polymer adhesive 525 may be an epoxy, olefin or a siloxane based polymer. For example, polydimethyl siloxane (PDMS) or poly (dimethyl diphenyl siloxane) may be used.

The PSH TIM 100 also includes a low melt solder having a melting point that is below about 183° C. Solder particles 550 are shown in FIG. 5. During reflow, as described below, the solder particles 550 may form a thermally conductive chain 575 between the die 140 and the block 125, making use of the PSH TIM 100 ideal for such an interface. That is, a thermally conductive chain 575 will allow heat generated within the die 140 to be readily transferred across the PSH TIM 100 to the block 125.

Embodiments of solder which may be used in the PSH TIM 100 include alloys of indium-tin-bismuth having a melting point of about 68° C., indium-tin having a melting point of between about 110° C. and about 118° C., tin-bismuth having a melting point of about 139° C., indium-silver having a melting point of about 143° C., and indium having a melting point of about 156° C. Additionally, other solders may be used which have a melting point of less than about 183° C.

Where the solder is an alloy, soldering or the forming of a thermally conductive chain 575 is achieved by application of a reflow temperature that exceeds the solder melting point, for example, by about 10° C. to about 20° C. above liquidus. This helps ensure that a complete uniform liquidus state is achieved for the alloy. For example, a PSH TIM 100 employing a solder of indium-tin-bismuth as noted above, may be exposed to a reflow temperature of about 80° C. (e.g. about 12° C. above the 68° C. melting point). Alternatively, a PSH TIM 100 employing a solder of tin-bismuth may be exposed to a reflow temperature of about 150° C. Additionally, where the solder is of a single material, such as indium, reflow may proceed at the melting point of the solder (e.g. at the melting point of about 156° C. for indium).

Figure 7:
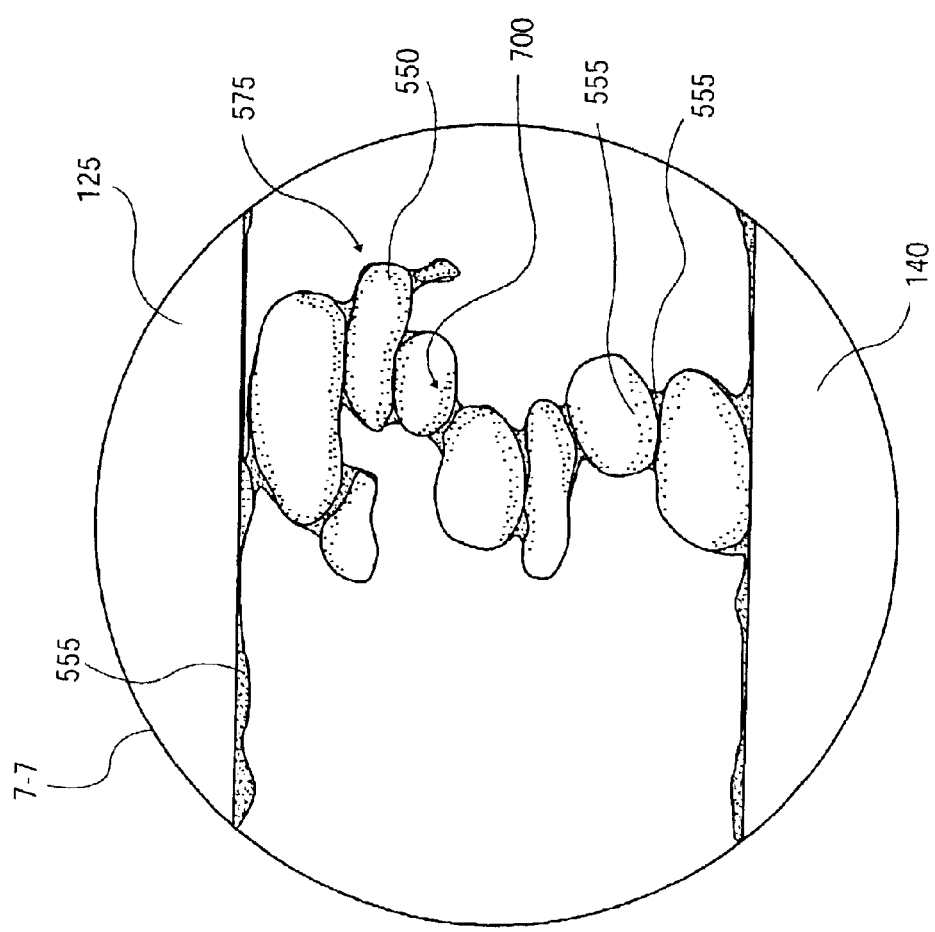
FIG. 7 is a magnified view of the polymer solder hybrid of FIG. 6, according to one embodiment of the invention.

The PSH TIM 100 also includes metal particle fillers 555. The fillers 555 included in the PSH TIM 100 have a melting point that is greater than a melting point of the solder particles 550. That is, the fillers 555 will have a melting point that is preferably at least about 183° C. Additionally, the ratio by weight of fillers 555 to solder particles 550 may be in the range of 20 to 99%, preferably between 40 to 80%, most preferable 50 to 70% of filler 555. As described below, this helps ensure complete inter-diffusion of fillers 555 into solder particles 550 and raises the melting point of the resulting metallurgical system. FIG. 7 shows a clear example of such inter-diffusion at regions of inter-diffusion 700.

While a low melt solder, such as indium-tin-bismuth noted above, would normally degrade or lack the robustness necessary to remain intact when subjected to a HAST, the addition of the fillers 555 prevents such an occurrence. The fillers 555 provide a sufficient degree of robustness to the PSH TIM 100 following reflow, such that the PSH TIM 100 remains intact following exposure to conditions such as HAST conditions. Embodiments of the PSH TIM 100 may employ fillers 555 such as finely distributed copper, gold or silver particles, or copper, gold or silver coated particles.

Continuing with reference to FIGS. 4 and 5, an embodiment of reflow is described in detail. As shown in FIG. 4, one embodiment of reflow begins by application of heat from a heat gun 450 to a concentrated area of the interface between the block 125 and the die 140. In this manner, the delivery of heat to other portions of the laptop 175 is minimized (see FIG. 1). As reflow ensues, a melting point of the solder particles 550 is achieved and thermally conductive chains 575 form. For example, in an embodiment employing a solder of indium-tin-bismuth, a reflow temperature of up to about 80° C. is applied with the solder beginning to melt at about 68° C. In this embodiment, the ratio by weight of fillers 555 to solder particles 550 may be in excess of about 95% fillers 555.

As shown in FIG. 5, the fillers 555 begin to accumulate about the solder particles 550 during reflow. Although the melting point of the fillers 555 is not initially achieved, a degree of inter-diffusion of fillers 555 into the melting solder particles 550 occurs (shown further in FIG. 7). For example, in an embodiment where the fillers 555 are of gold, having a melting point in excess of about 1064° C., the gold fillers 555 remain in solid form as they adhere to or diffuse into the solder particles 550. In this embodiment, employing in excess of about 95% gold filler and indium-tin-bismuth solder, reflow temperatures may be maintained for between about 5 and about 50 minutes to obtain a maximum inter-diffusion of the fillers 555 into the solder particles 550.

The inter-diffusion described above will continue until a natural equilibrium of the fillers 555 into the solder particles 550 is achieved. As indicated at block 840 of FIG. 8, this is the case even where heat is removed and reflow is terminated prior to achieving complete inter-diffusion. For example, in the above scenario, the gold fillers 555 will continue to diffuse into the indium-tin-bismuth solder particles 550, even if reflow is terminated and the heat gun 450 removed after less than about 5 minutes of reflow. In such cases, complete inter-diffusion may be achieved in a matter of months while the die 140 is shelved at room temperature. On the other hand, as indicated at block 850 of FIG. 8, reflow may continue until a maximum or complete inter-diffusion is achieved. That is, once reflow has begun and the melting point of the solder achieved, the continued application of heat hastens the diffusion of the fillers 555 into the solder particles 550. In this scenario, maximum inter-diffusion is achieved in a matter of minutes (e.g. from about 5 to about 50 minutes as noted in the above example).

The actual amount of time to utilize for reflow is a matter of design choice. A factor to be considered may include the minimum amount of inter-diffusion actually desired, for example, to achieve a melting point for the metallurgical system of between about 130° C. and about 150° C. for testing. As shown at block 842 of FIG. 8, another factor to be considered may be the anticipated shelf life of the laptop 175 shown in FIG. 1 before actual use (e.g. by the end user). That is, the shelf life may provide additional time for inter-diffusion. Additional considerations as noted at block 847 of FIG. 8 may include anticipated subsequent heat testing, such as application of a HAST which may contribute to further inter-diffusion.

Figure 6:
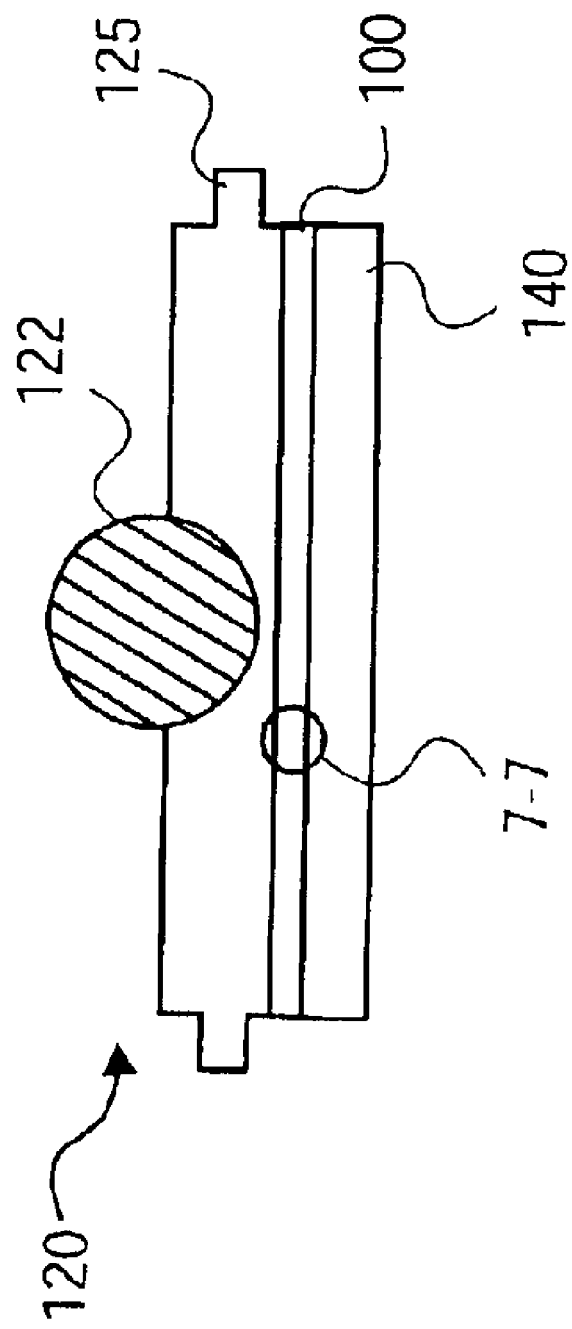
FIG. 6 is a side view of the die with polymer solder hybrid of FIG. 5 following exposure to the heat gun of FIG. 4, according to one embodiment of the invention.

With reference to FIGS. 6 and 7, the inter-diffusion described above is explained in further detail. FIG. 6, reveals the thermal management assembly 120 of FIG. 4 secured to the die 140 with the PSH TIM 100 of FIG. 5. Reflow as described above has ceased and the heat gun 450 of FIG. 4 has been removed.

FIG. 7 is an exploded view taken from section 7—7 of FIG. 6. In the embodiment shown, regions of inter-diffusion 700 within the solder particles 550 can be seen. The regions of inter-diffusion 700 shown, reveal fillers 555 as described above as having diffused into the solder particles 550. As shown in FIG. 7, the thermally conductive chain 575 includes fillers 555 disbursed therein forming a new filler-solder alloy. The filler 555 distribution as shown in FIG. 7 allows heat to be readily transferred directly across the thermally conductive chain 575 without having to jump from one solder particle 550 to another.

As a result of this inter-diffusion, the melting point of the inter-diffused solder particles 550 (i.e. the new filler-solder alloy) is increased and robustness is much improved. For example, in a PSH TIM 100 embodiment utilizing indium-tin-bismuth solder alloy particles 550 with a maximum amount of gold fillers 555 diffused thereinto, the metallurgical system complete with thermally conductive chain 575 as shown may display a melting point in excess of about 600° C. with dramatically increased robustness. The exact degree to which the PSH TIM 100 increases in robustness or the thermally conductive chain 575 increases in melting point is again a matter of design choice. For example, the ratio by weight of fillers 555 to solder may be chosen to achieve a particular robustness or melting point.

Referring to FIG. 8, a summary of methods employing the PSH TIM described above is shown in the form of a flow-chart. Methods include delivering PSH TIM to a die for securing a thermal management assembly thereto. Reflow may be applied and terminated before a complete inter-diffusion of fillers into a solder of the PSH TIM as shown at block 840. Alternatively, as shown at block 850, reflow may be applied until the inter-diffusion is completed. Regardless, the PSH TIM remains stable and reliable upon use of the die or upon exposure to industry standard testing such as application of a HAST.

Embodiments described above include PSH TIMs that may employ a low melt solder without sacrificing the robustness necessary to withstand industry standard requirements. Embodiments described above include combinations of low melt solders and high melt fillers to form PSH TIMs.

Although exemplary embodiments describe particular PSH TIM configurations, additional embodiments are possible. For example, additional low melt solders may be used in conjunction with additional high melt fillers to form a wide variety of PSH TIM configurations. Additionally, many changes, modifications, and substitutions may be made without departing from the spirit and scope of these embodiments.

We claim:

1. A polymer solder hybrid thermal interface material comprising an alloy of a gold filler and an indium-tin-bismuth solder, a melting point of the alloy being greater than a melting point of the solder, and wherein the melting point of the alloy is approximately 600° C.

2. The polymer solder hybrid thermal interface material of claim 1 wherein the melting point of the solder is less than about 183° C.

3. The polymer solder hybrid thermal interface material of claim 2 wherein a melting point of the filler is greater than about 183° C.

4. The polymer solder hybrid thermal interface material of claim 1 wherein the alloy is to form a thermally conductive chain between a die and a thermal management assembly.

5. The polymer solder hybrid thermal interface material of claim 4 wherein the thermal management assembly includes a heat pipe.

6. A polymer solder hybrid thermal interface material comprising:
   a gold filler; and
   an indium-tin-bismuth solder having a first robustness, said polymer solder hybrid thermal interface material to include an alloy of said filler and said solder, the alloy, to have a second robustness greater than the first robustness and wherein the melting point of the alloy is approximately 600° C.

7. The polymer solder hybrid thermal interface material of claim 6 wherein a ratio by weight of said filler to said solder is more than about 20% filler.

8. The polymer solder hybrid thermal interface material of claim 7 wherein the ratio is between about 40% filler and about 80% filler.

9. The polymer solder hybrid thermal interface material of claim 8 wherein the ratio by weight of the gold filler to the indium-tin-bismuth solder is greater than 95%.

10. A method comprising:
    providing a polymer solder hybrid thermal interface material to a die, the polymer solder hybrid thermal interface material including a gold filler and an indium-tin-bismuth solder, and wherein the melting point of the alloy is approximately 600° C.; and
    applying a reflow temperature of less than a melting point of the solder and greater than a melting point of the filler to the polymer solder hybrid thermal interface material to form an alloy of at least a portion of the filler diffused into the solder, the alloy having a melting point greater than the melting point of the solder.

11. The method of claim 10 further comprising delivering a thermal management assembly to the die prior to said applying.

12. The method of claim 11 wherein the alloy forms a thermally conductive chain between the die and the thermal management assembly.

13. The method of claim 10 wherein the reflow temperature is less than about 183° C.

14. The method of claim 13 wherein the reflow temperature is between about 80° C. and about 150° C.

15. The method of claim 10 wherein said applying is maintained for a time sufficient to diffuse a maximum amount of the filler into the solder.

16. The method of claim 15 wherein the time is between about 5 minutes and about 50 minutes.

17. A method comprising:
    providing a polymer solder hybrid thermal interface material to a die, the polymer solder hybrid thermal interface material including a filler and a solder;
    applying a reflow temperature greater than a melting point of the solder and less than a melting point of the filler to the polymer solder hybrid thermal interface material to form an alloy of a portion of the filler diffused into the solder, the alloy having a melting point greater than the melting point of the solder, the reflow temperature is applied for less than approximately 5 minutes before terminating; and
    terminating said applying prior to forming an alloy of all of the filler diffused into the solder.

18. The method of claim 17 further comprising shelving the die at room temperature after said terminating, another portion of the filler to diffuse into the solder during the shelving.

19. The method of claim 17 further comprising applying a heat testing temperature to the polymer solder hybrid thermal interface material, another portion of the filler to diffuse into the solder during said applying of the heat testing temperature.

20. A method comprising:
    delivering a polymer solder hybrid thermal interface material to a surface, the polymer solder hybrid thermal interface material including an alloy of a gold filler and an indium-tin-bismuth solder, and wherein the melting point of the alloy is approximately 600° C.; the alloy having a melting point greater than an initial melting point of the solder; and
    applying a heat testing temperature to the polymer solder hybrid thermal interface material.

21. The method of claim 20 wherein said applying occurs for more than about 75 hours and the heat testing temperature is greater than about 100° C.

22. A system comprising:
    a die;
    a polymer solder hybrid thermal interface material on said die and including an alloy of a filler and a solder, the alloy having a first melting point greater than a second melting point of the solder; and
    a thermal management assembly secured to said die with said polymer solder hybrid thermal interface material, the thermal management system comprising a heat pipe having a metal plate, coupled thereto, to receive heat transferred therefrom, and including a block to secure the heat pipe, wherein the heat pipe is secured to said block with said polymer solder hybrid thermal interface material and said metal plate is coupled to said heat pipe with said polymer solder hybrid thermal interface material.

* * * * *